(12) United States Patent
Hartley et al.

(10) Patent No.: US 12,237,686 B2
(45) Date of Patent: Feb. 25, 2025

(54) POWER DISTRIBUTION METHOD AND APPARATUS

(71) Applicants: Sustainable Business Energy Solutions Pty Ltd, Sydney (AU); Siemens Ltd, Bayswater (AU)

(72) Inventors: Oliver Hartley, Sydney (AU); Luke Butterworth, Sydney (AU); Matthias Huchel, Sydney (AU); Jose Roberto Moreira Rodrigues, Bayswater (AU); Musa Chibowora, Bayswater (AU); Jean-Louis Francisco De Geronimo Salinas, Bayswater (AU)

(73) Assignees: Sustainable Business Energy Solutions Pty Ltd, Sydney (AU); Siemens Ltd, Bayswater (AU)

(*) Notice: Subject to any disclaimer, the term of this patent is extended or adjusted under 35 U.S.C. 154(b) by 315 days.

(21) Appl. No.: 17/640,091

(22) PCT Filed: Sep. 4, 2020

(86) PCT No.: PCT/AU2020/050927
§ 371 (c)(1),
(2) Date: Mar. 3, 2022

(87) PCT Pub. No.: WO2021/042167
PCT Pub. Date: Mar. 11, 2021

(65) Prior Publication Data
US 2022/0302710 A1    Sep. 22, 2022

(30) Foreign Application Priority Data
Sep. 5, 2019    (AU) .................................. 2019903283

(51) Int. Cl.
*H02J 3/38* (2006.01)
*G01R 19/25* (2006.01)
*H02S 40/36* (2014.01)

(52) U.S. Cl.
CPC .......... *H02J 3/381* (2013.01); *G01R 19/2513* (2013.01); *H02J 2300/24* (2020.01); *H02S 40/36* (2014.12)

(58) Field of Classification Search
None
See application file for complete search history.

(56) References Cited

U.S. PATENT DOCUMENTS

| 2009/0000654 A1 | 1/2009 | Rotzoll et al. |
| 2010/0148579 A1 | 6/2010 | Maloney |

(Continued)

FOREIGN PATENT DOCUMENTS

| CN | 202548620 U | 11/2012 |
| CN | 104052150 A | 9/2014 |

(Continued)

OTHER PUBLICATIONS

Australian Patent Office International-Type Search Reported issued in Australian Pat. Appl. No. 2019903283 dated Mar. 16, 2020.

(Continued)

*Primary Examiner* — Cassandra F Cox
(74) *Attorney, Agent, or Firm* — MASCHOFF BRENNAN; Paul G. Johnson (57) ABSTRACT

A power distribution apparatus, comprising: a plurality of switches each operable to switch a respective power source of a plurality of power sources between a first input node of a first load and a second input node of a second load; a first power meter configured to determine a first power being delivered to the first input node from the plurality of power sources via the plurality of switches; a second power meter (Continued)

configured to determine the power consumption of the first load; and a control module configured to control the switches to distribute power between the first and second loads in dependence on the determined first power and the determined power consumption of the first load.

17 Claims, 9 Drawing Sheets

(56) References Cited

U.S. PATENT DOCUMENTS

| | | | |
|---|---|---|---|
| 2012/0126623 A1 | 5/2012 | Koehl | |
| 2012/0274133 A1 | 11/2012 | Takehara et al. | |
| 2013/0099566 A1 | 4/2013 | Pfitzer et al. | |
| 2014/0125136 A1 | 5/2014 | Toya et al. | |
| 2015/0180230 A1 | 6/2015 | Xu et al. | |
| 2016/0049794 A1 | 2/2016 | Liu et al. | |
| 2018/0254633 A1 | 9/2018 | Covic et al. | |

FOREIGN PATENT DOCUMENTS

| | | |
|---|---|---|
| DE | 102011010791 A1 | 8/2012 |
| GB | 2519755 A | 5/2015 |
| JP | 2012-235606 A | 11/2012 |
| JP | 2013-183549 A | 9/2013 |
| JP | 2014-135855 A | 7/2014 |
| JP | 2016-116379 A | 6/2016 |
| JP | 2016-174437 A | 9/2016 |
| JP | 2017-169309 A | 9/2017 |
| WO | WO-2016033597 A1 | 3/2016 |
| WO | WO-2017/008090 A2 | 1/2017 |
| WO | WO-18184076 A1 | 10/2018 |

OTHER PUBLICATIONS

International Preliminary Report on Patentability issued in PCT Patent Appl. No. PCT/AU2020/050927 dated Mar. 8, 2022.
International Search Report issued in PCT Patent Application No. PCT/AU2020/050927 dated Oct. 12, 2020.
Extended European Search Report, as issued in connection with European Application No. 20861298.6, dated Aug. 31, 2023, 8 pgs.

POWER DISTRIBUTION METHOD AND APPARATUS

TECHNICAL FIELD

The present disclosure relates to apparatus and methods for distributing power, in particular solar power generated by multiple solar generators.

BACKGROUND

In recent years, non-residential solar energy generation has been catered for predominantly by large scale solar farms built on low-cost land in remote rural areas. Whilst able to generate large amounts of energy, the remoteness of these farms from energy demand means that electricity generated at these sites must be transmitted long distances on overhead lines leading to significant loss. Additionally, the repurposing of agricultural and other land for solar power generation can have a negative socio-economic impact on local communities and flora and fauna.

The increasing availability of cheap and efficient solar cells has led to more widespread adoption of the technology closer to the city, with owners of commercial buildings installing "behind-the-meter" solar systems on building roofs to provide a reduction of electricity consumption of the building from the electrical grid. Whilst these systems can provide a small source of income for the landlord or system operator, it has historically been difficult to selectively sell energy on the national energy market (NEM) or electricity wholesale market, since any excess solar electricity generated by these systems is exported through the tenant meter which is outside of the control of the system operator. As such, roof installed solar systems, even on very large roofs, are typically limited in size such that their output matches the daytime electricity consumption of the building. Because of this, large industrial roof tops in urban areas have to-date been under-utilised for solar energy generation.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each of the appended claims.

SUMMARY

According to a first aspect of the disclosure, there is provided a power distribution apparatus, comprising: a plurality of switches each operable to switch a respective power source of a plurality of power sources between a first input node of a first load and a second input node of a second load; a first power meter configured to determine a first power being delivered to the first input node from the plurality of power sources via the plurality of switches; a second power meter configured to determine a power consumption of the first load; and a control module configured to control the switches to distribute power between the first and second loads in dependence on the determined first power and the determined power consumption of the first load.

Each of the plurality of switches may be configured to mechanically segregate a respective power source from one of the first load and the second load.

Each respective power source may comprise one or more solar cells and/or one or more power storage devices.

In some embodiments, the first load is a local load. For example, the local load may be a warehouse or other commercial building in close proximity to the plurality of power sources. In some embodiments, the second load is an electrical grid or the like. In some embodiments, the first load is coupled to the electrical grid via a third node.

In some embodiments, the power distribution apparatus may further comprise a first electricity meter coupled between the third node and the electrical grid. Additionally or alternatively, the power distribution apparatus may comprise a second electricity meter coupled between the second input node and the electrical grid. In some embodiments, the first and second electricity meters may be coupled to the electrical grid via a common transformer. In other embodiments, the first and second electricity meters are coupled to the electrical grid via separate transformers.

In some embodiments, the power distribution apparatus may further comprise a first electrical meter coupled between the second input node and the third node, and a second electrical meter coupled between the third node and the electrical grid.

In some embodiments, the power consumption of the first load is determined by the second power meter is the total power consumption of the first load. In other embodiments, the power consumption determined by the second power meter is the power consumed by the first load from the second load (e.g. the electrical grid), for example measured at the third node.

The controller may be configured to control the plurality of switches such that the measured first power provided to the first input node is greater than or equal to the measured power consumption of the first load.

The controller may be configured to control the plurality of switches such that the measured first power provided to the first input node substantially matches the measured power consumption of the first load.

The power distribution apparatus may further comprise a third power meter configured to measure power being delivered to the second input node by the plurality of power sources via the plurality of switches. The control module may be configured to control the switches to distribute power between the first and second loads in dependence on the measured power being delivered to the second input node.

The plurality of power sources may be direct current (DC) power sources. The apparatus may further comprise an inverter coupled between each of the respective power sources and the plurality of switches to convert DC to alternating current (AC).

According to another aspect of the disclosure, there is provided a system, comprising: the power distribution apparatus as described above; and the plurality of power sources.

According to another aspect of the disclosure, there is provided a method of distributing power from a plurality of power sources between a first load and a second load, each of the plurality of power sources switchable between the first load and the second load by a respective switch of a plurality of switches, the method comprising: determining a first power being delivered to the first input node from the plurality of power sources; determining a power consumption of the first load; control the plurality of switches to distribute power between the first and second loads in dependence on the determining first power and the determining power demand of the first load.

Each of the plurality of switches is configured to mechanically segregate a respective power source from one of the first load and the second load.

Each respective power source comprises one or more solar cells and/or one or more batteries.

In some embodiments, the first load is a local load. For example, the local load may be a warehouse or other commercial building in close proximity to the plurality of power sources. In some embodiments, the second load is an electrical grid or the like. In some embodiments, the first load is coupled to the electrical grid via a third node.

In some embodiments, the power consumption of the first load as determined by the second power meter is the total power consumption of the first load. In other embodiments, the power consumption determined by the second power meter is the power consumed by the first load from the second load (e.g. the electrical grid), for example measured at the third node.

Determining the power consumption of the first load may comprise measuring a power being delivered to the first load via the third node.

The method may further comprise measuring power being delivered to the second input node by the plurality of power sources via the plurality of switches. The switches may be controlled in dependence on the measured power being delivered to the second input node.

The plurality of switches may be controlled such that the measured first power provided to the first input node is greater than or equal to the measured power consumption of the first load.

The plurality of switches may be controlled such that the measured first power provided to the first input node substantially matches the measured power consumption of the first load.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

DESCRIPTION OF EMBODIMENTS

Embodiments of the present disclosure address or at least ameliorate one or more of the issues described above by de-coupling the electricity consumption of the building from the size of the solar system which can be installed on the roof. By enabling an operator of a solar system to efficiently distribute electricity generated by a solar array between the building, offsetting local electricity consumption, and the national energy market as a registered market participant, entire industrial and commercial roof areas and surrounding land can be converted into local market participating solar power stations. For industrial warehouses located in urban areas close to network demand, overall grid stability can be increased and potential risk from declining Marginal Loss Factors (MLF) decreased when compared to remote solar farms. This benefit distinguishes urban based "roof farms" from large-scale solar farms in remote rural areas. In addition, solar power generated through such roof farms does not require any additional land thereby reducing social or environmental impact.

Embodiments of the present disclosure enable dynamic sharing of power generated by the solar system between the building (e.g. "behind-the-meter") and a registered network meter (NEM meter). This segregation of generated electricity to two separate nodes enables solar systems to comply with any grid connection constraints from distribution network service providers (DNSP), such as Endeavour Energy in Australia, as well as the Australian Energy Market Operator (AEMO).

Figure 1:
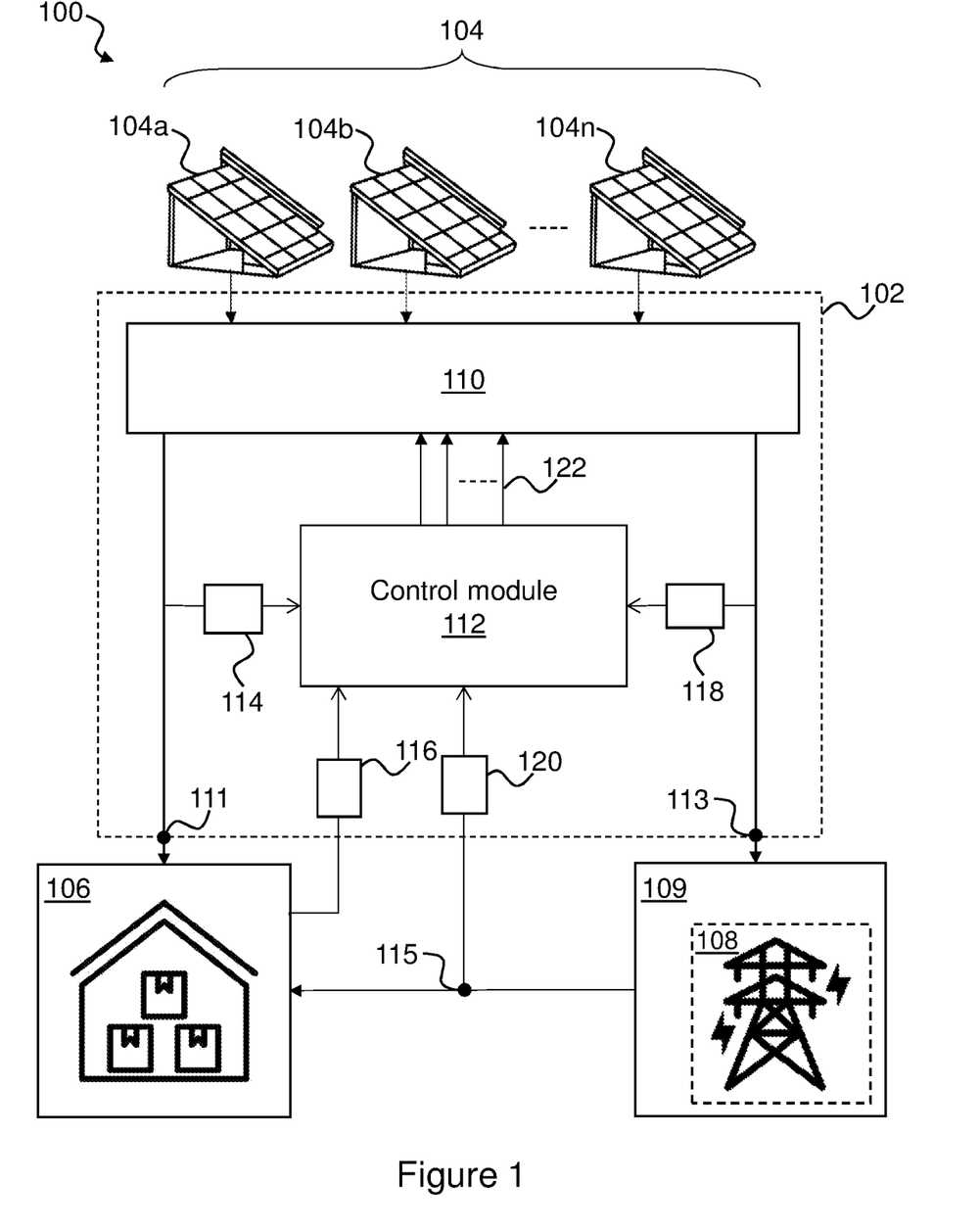
FIG. 1 is a schematic diagram of a system comprising a power distribution apparatus according to embodiments of the disclosure.

FIG. 1 is a schematic diagram of a system 100 comprising a power distribution apparatus 102 according to various embodiments of the disclosure, in addition to a solar array 104 comprising a plurality of solar panels 104a-104n, a first load 106, such as a local load to the solar arrays 104, and a second load 108, such as an electrical grid, via a grid connection 109. The first and/or second loads 106, 108 may be configured to consume power as well as provide power depending on system conditions. For example, where the second load 108 is an electrical grid, power may be consumed from the second load and/or fed back to the second load 108. The power distribution apparatus 102 is configured to distribute power generated from the plurality of solar arrays (or cells) between a first output node 111 which may be coupled to an input node of the first load 104, and a second output node 113 which may be coupled to an input node of the second load 108.

In some embodiments, the first load 106 may comprise substantially all of the load of a building upon which the solar array 104 is located. For example, the solar array 104 may be fixed to the roof of a building and the first load 106 may represent some or all of the electricity used by the building. In other embodiments, the first load 106 may comprise load from a plurality of buildings or electrical devices in the vicinity of the solar array 104.

The power distribution apparatus 102 comprises a switch bank 110 and a control module 112. In addition, one or more power meters 114, 116, 118, 120 may be provided to measure power (or voltage or current) being delivered to various nodes in the system 100. For example, a first power meter 114 may be provided to measure the power delivered to the first output node 111 via the switch bank 110 from the solar array 104. For example, a second power meter 116 may be provided to measure the power demand of the first load 106. For example, a third power meter 118 may be provided to measure the power being delivered to the second output node 113. For example, a fourth power meter 120 may be provided to measure the power being delivered to the first load 106 from the second load 108 (e.g. the electrical grid).

The switch bank 110 may be operable to switch an electrical output of each panel 104a-104n in the solar array 104 between the first and second loads 106, 108 upon receipt of one or more control signals 122 from the control module 112. The control signals 122 may be applied directly or indirectly to each switch in the switch bank 110. The measured power from one or more of the power meters 114, 116, 118, 120 may be provided to the control module 112 which may then use this information to control the distribution of power using the switch bank 110 from the solar array 104 between the first and second loads 106, 108.

Figure 2:
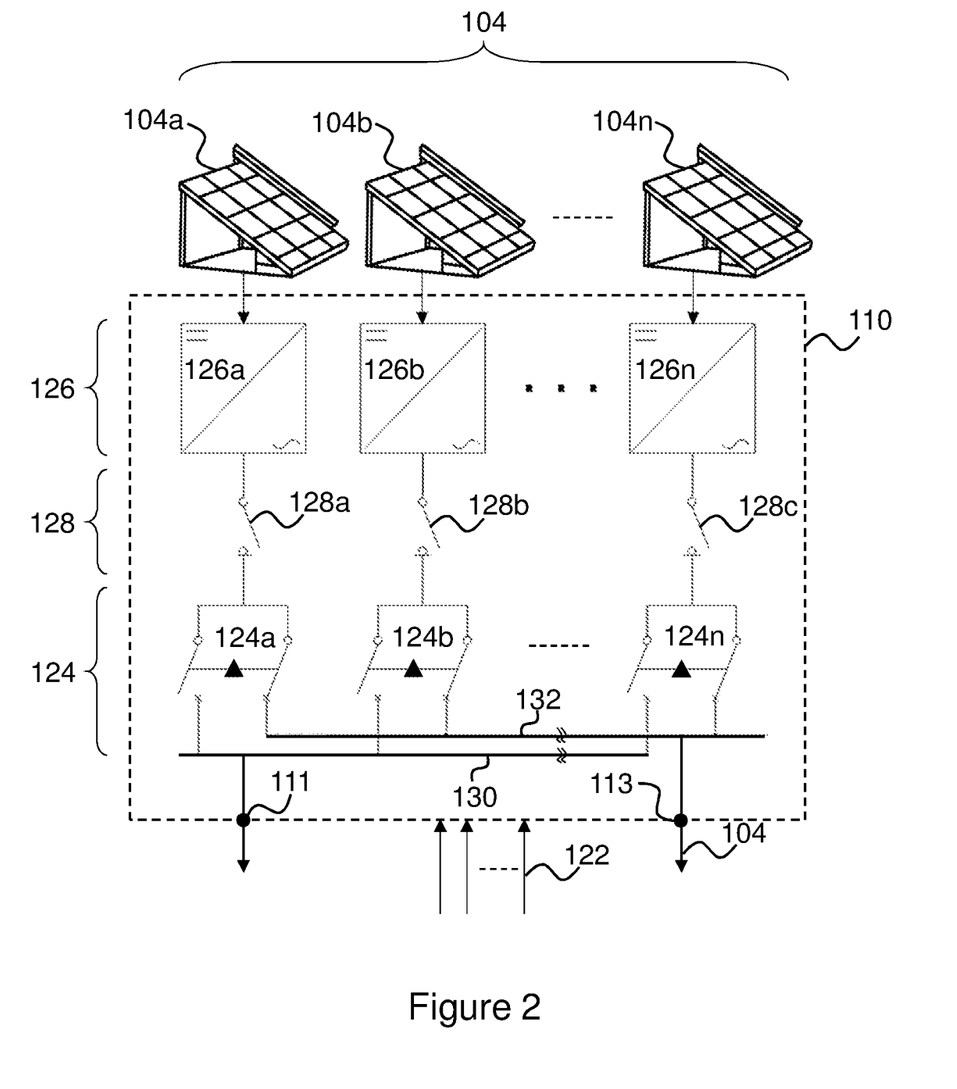
FIG. 2 is a schematic diagram showing in more detail a switch bank of the power distribution apparatus of FIG. 1 according to embodiments of the disclosure.

FIG. 2 is a more detailed schematic diagram of the switch bank 110 shown in FIG. 1. The switch bank 110 comprises a plurality of switches 124, which may each be operable to mechanically segregate a respective power source from one of the first and second loads. In some embodiments, the plurality of switches are mechanical interlock switches or other similar switch enabling full electrical isolation at any point in time between the first and second loads 106, 108.

The switch bank 110 in FIG. 2 is configured to switch alternating current (AC) between first and second nodes 111, 113. The inventors have found that switching AC power (as opposed to direct current (DC) power) leads to improved switch control and a reduction in wear on switchgear when compared to switching DC. The switch bank 110 therefore additionally comprises a plurality of inverters 126, each configured to convert a direct current (DC) power signal received from a respective solar panel 104a-104n of the array 104 to an alternative current (AC) power signal. In the embodiment shown, the inverters 126 are implemented as part of the power distribution apparatus 110. In alternative embodiments, the inverters 126 may be integrated with the solar panels 104a-104n of the solar array.

The AC power signal output from each inverter 126a-126n is then provided to an input node of a respective one of the switches 124, optionally via an isolator switch 128. The isolator switches 128a-128n may be provided to enable each of the solar panels 104a-104n to be electrically isolated from the remaining system 100. The isolator switches 128a-128n may be manual switches which may be located in proximity to the solar array 124. Alternatively, the isolator switches 128a-128n may be controlled by the control module 112.

Each of the switches 124 is switchable between a first switch bus 130 and a second switch bus 132 which are respectively coupled to the first and second nodes 111, 113 of the power distribution apparatus 102. Each switch 124 is thus configurable to direct AC power received from a respective inverter 126 to either the first node 111 via the first switch bus 130, or the second node 113 via the second switch bus 132. In doing so, the switch bank 110 provides an efficient way of distributing power generated from the solar array 104 between multiple loads. Further, the share of power provided to each the first and second nodes 111, 113 are completely electrically isolated due to the use of mechanical interlock switches.

Figure 3:
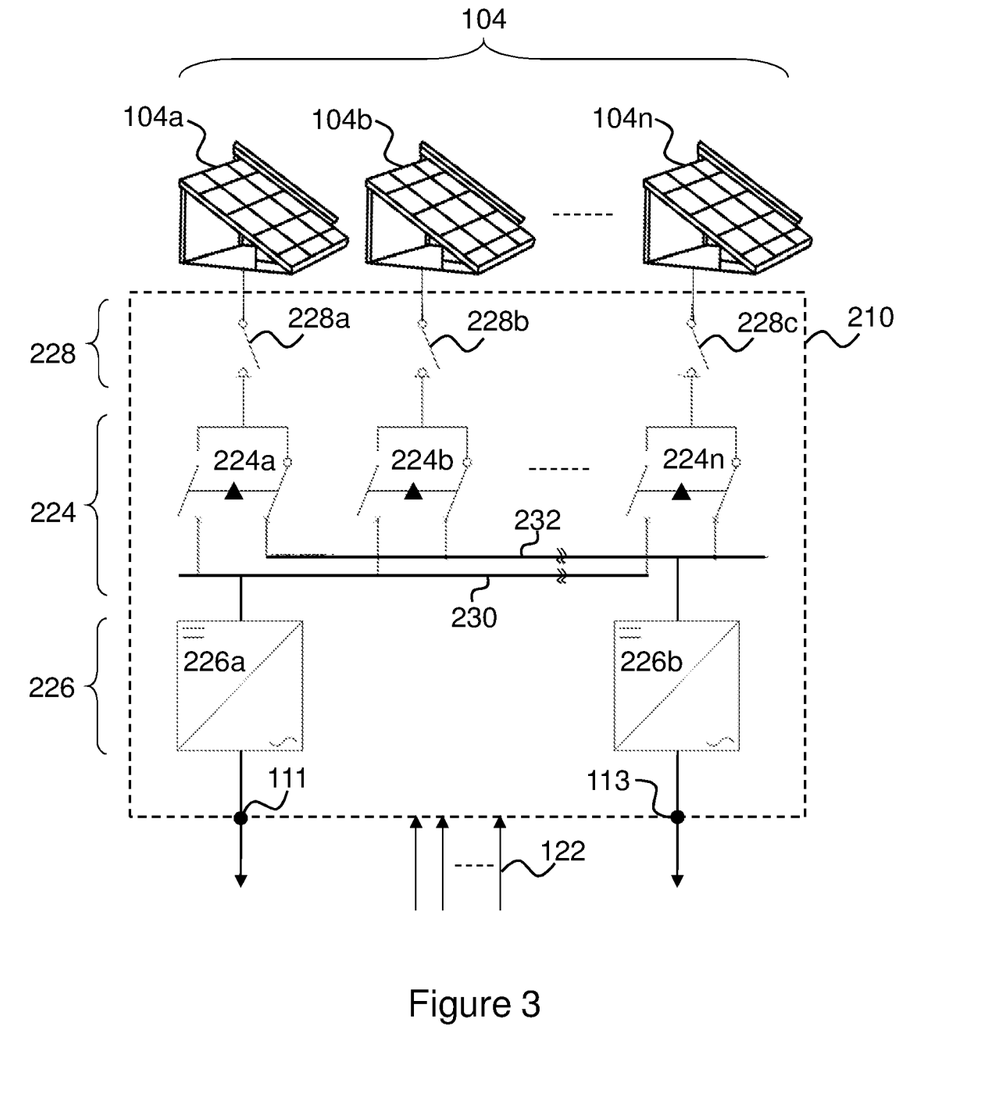
FIG. 3 is a schematic diagram showing in more detail a switch bank of the power distribution apparatus of FIG. 1 according to embodiments of the disclosure.

FIG. 3 is a schematic diagram of a switch bank 210 which is a variation of the switch bank 110 shown in FIG. 2. In contrast the switch bank 110 described above, the switch bank 210 of FIG. 3 is operable to switch DC. The switch bank 210 comprises a plurality of switches 224, first and second inverters 226a, 226b and optionally a plurality of isolator switches 228. DC output from each solar panel 104a-104n in the array 104 is provided to a respective input node of the switches 224, via optional isolator switches 228. As with isolator switches 128 of the switch bank 110 of FIG. 2, the isolator switches 228 are provided to enable each of the solar panels 104a-104n to be electrically isolated from the switch bank 210. Each of the switches 224 is switchable between a first switch bus 230 and a second switch bus 232 which are respectively coupled to a DC input of the first and second inverters 226a, 226b. The first and second inverters 226a, 226b then each convert an aggregated DC power signal on the first and second switch buses 230, 232 to AC output signals which are respectively provided to the first and second output nodes 111, 113 of the power distribution apparatus 102. Thus each switch 224 is configurable to direct DC power received from a respective solar panel 104a-104n to either the first output node 111 via the first inverter 226a, or the second output node 113 via the second inverter 226b. Again, like the switch bank 110 shown in FIG. 2, the first and second output nodes 111, 113 are fully electrically isolated from one another due to the nature of the switches 224.

Figure 4:
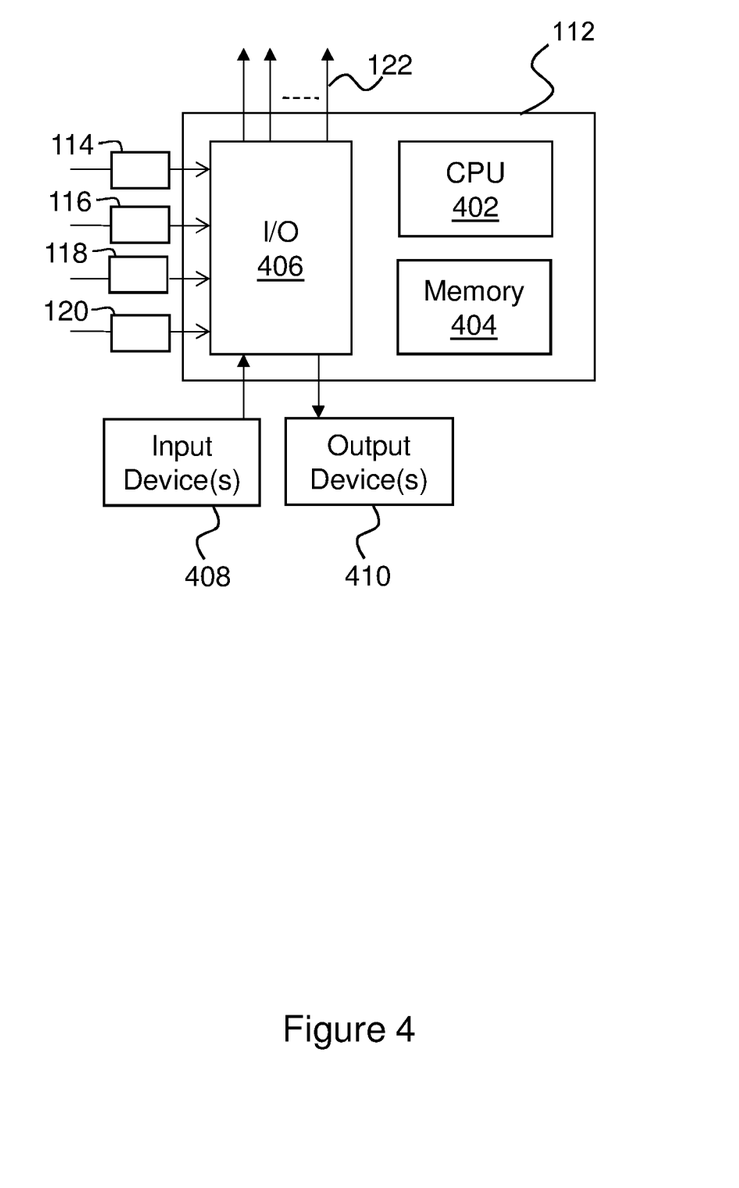
FIG. 4 is a schematic diagram showing in more detail the control module of the power distribution apparatus of FIG. 1 according to embodiments of the disclosure.

An example configuration of the control module 112 according to embodiments of the disclosure is illustrated in FIG. 4. The control module 112 may comprise a central processing unit (CPU) 402, memory 404, and an input/output (I/O) bus 406 communicatively coupled with one or more of the CPU 402 and memory 404. The control module 112 is configured to receive signals from respective first, second, third and fourth power meters 114, 116, 118, 120 on the I/O bus and generate switching signals 122 to control switches in the switch bank 110 to switch each of the solar panels 104a-104n between the first load 106 and the second load 108 based on the received signals. Each power meter 114, 116, 118, 120 may include one or more amplifiers and digital signal processing circuitry for measuring and/or analysing power signals. In some embodiments, some or all elements of the power meters 114, 116, 118, 120 may be integrated within the processing unit 402. Communication between the power meters 114, 116, 118, 120 and the I/O port may be wired or may be via a wireless link, such as over inductive coupling, WiFi®, Bluetooth® or the like.

The control module 112 may be coupled to one or more input devices 408 and/or one or more output devices 410. Input devices 408 may include but are not limited to one or more of a keyboard, mouse, touchpad and touchscreen. Examples of output devices include displays, touchscreens, light indicators (e.g. light emitting diodes (LEDs)), sound generators and haptic generators. Input and/or output devices 408, 410 may be configured to provide information or feedback (e.g. visual, auditory or haptic feedback) to a user related, for example, to current power conditions at each of the first and second nodes 111, 113 and the power consumption of the first load 106. To this end, one or more of the input devices 408 may also be the output device 410, e.g. a touchscreen. Input and output devices 408, 410 may also be wired or wirelessly connected to the control module 112. Input and output devices 408, 410 may be configured to provide the user of the system 100 with control of the distribution of power between the first and second loads 106, 108.

The control module 112 may be operable to control the switches 124 in a number of ways depending on the desired operation of the system operator. In some embodiments, the control module 112 may operate to maximise the amount of energy being provided to the first load 106 from the solar array 104, only directing power to the second load 108 when it is ascertained that the solar array is fully servicing the energy needs of the first load 106. For example, the control module 112 may compare the power being provided to the first input node 111 by the solar array 104 with the power consumption of the first load 106 using the first and second power meters 114, 116 and control the switches to substantially match the power consumption of the first load 106 with the power being provided to the first input node 111. If the power consumption of the first load 106 measured by the second power meter 116 increases, the control module 112 may increase the number of solar panels 104a-104n providing power to the first input node 111 by switching one or more of the plurality of switches 124. Additionally or alternatively, where a connection exists between the second load 108 and the first load 106 via a third node 115, the control module 112 may control switching of the solar panels 104a-104n in the solar array by measuring, using the fourth power meter 120, the power being provided to the first load 106 by the second load 108. For example, when the measured power being provided at the third node 115 is above some threshold T, for example zero, the control module 112 may be configured to increase the number of solar panels 104a-104n switched to the first input node 111 to increase the power being provided to the first load 106 by the solar array 104 and thus reduce the load being provided to the first load 106 from the second load 108. In the above examples, the third power meter 118 may be used to measure the energy being provided to the second load 108 by the solar array 104.

In addition to or instead of using measured power received from one or more of the power meters 114, 116, 118, 120, the control module 112 may receive information pertaining to current wholesale and/or residential market prices of energy. In which case, the control module 112 may determine whether to direct energy to the first load 106 or the second load 108 depending on the cost benefit of trading energy with the second load 108, particularly where the second load 108 is an electrical grid. For example, the system operator may choose to service some of the energy requirements of the first load 106 using the solar array 104 and sell the remaining energy generated by the solar array 104 via the second load 108 such that the first load 106 has to import its energy deficit from the second load 108 via the third node 115.

Figure 5:
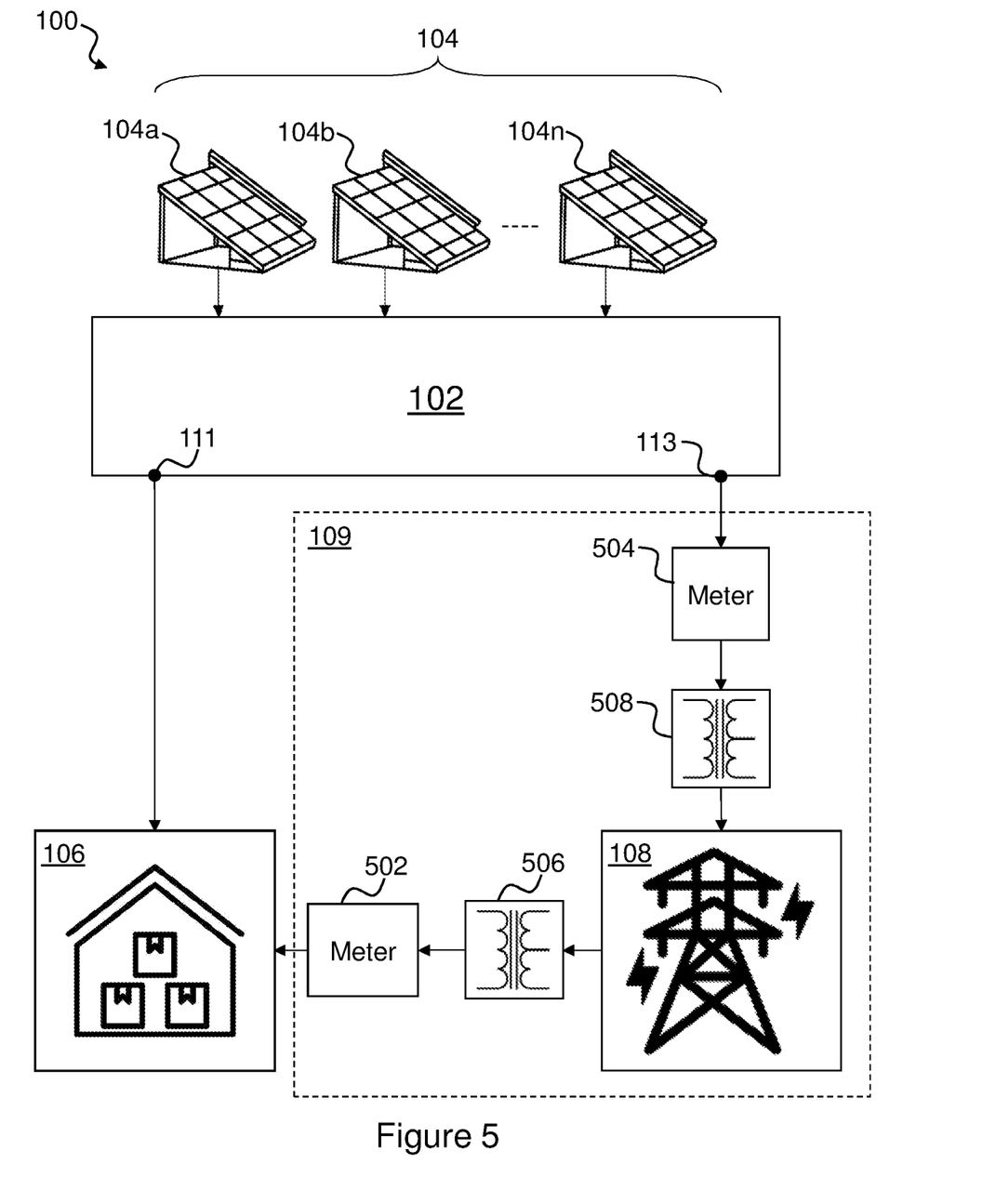
FIG. 5 is a schematic diagram showing in detail an example of an electrical grid connection to the power distribution apparatus of FIG. 1 according to embodiments of the disclosure.
Figure 6:
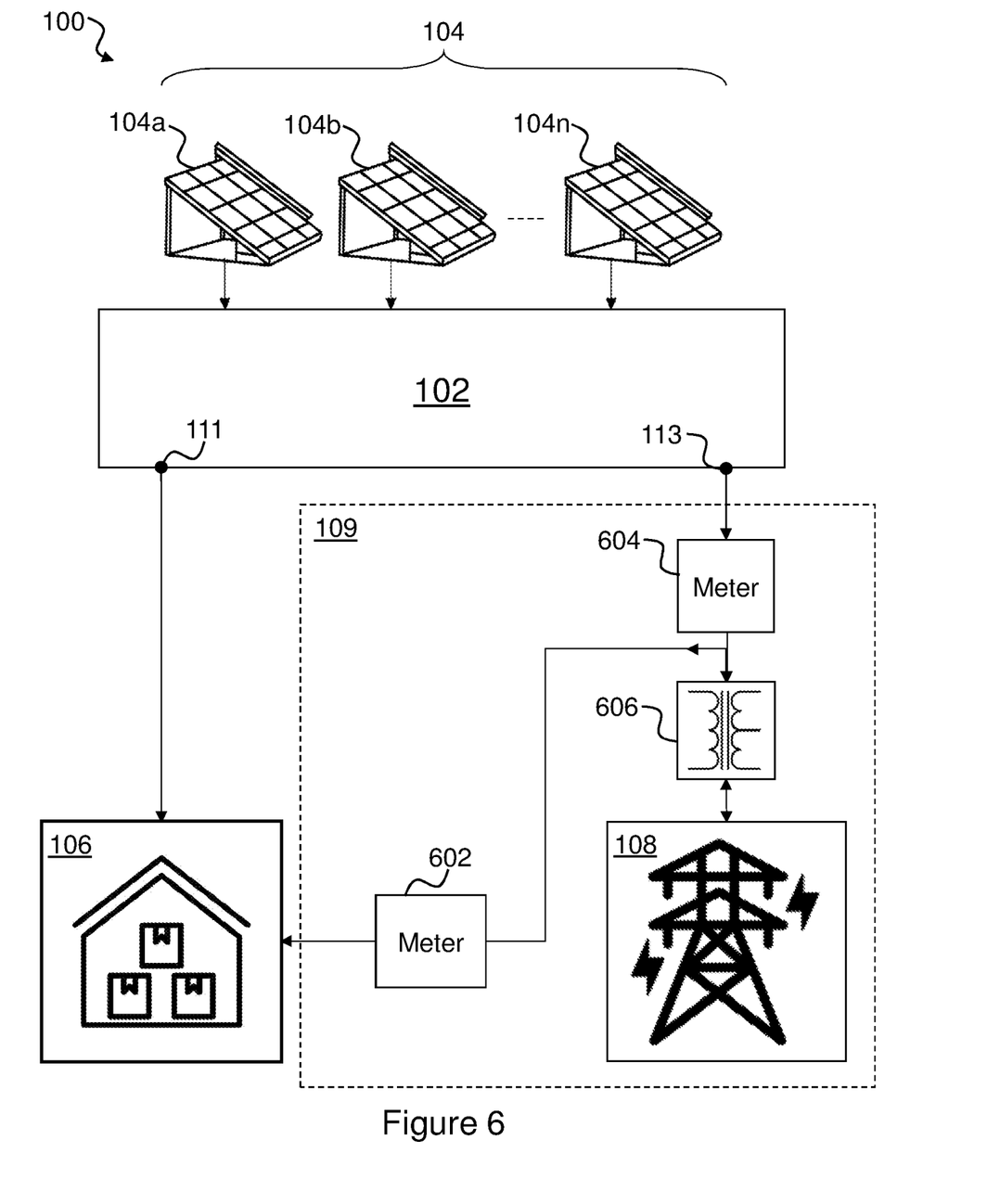
FIG. 6 is a schematic diagram showing in detail another example of an electrical grid connection to the power distribution apparatus of FIG. 1 according to embodiments of the disclosure.
Figure 7:
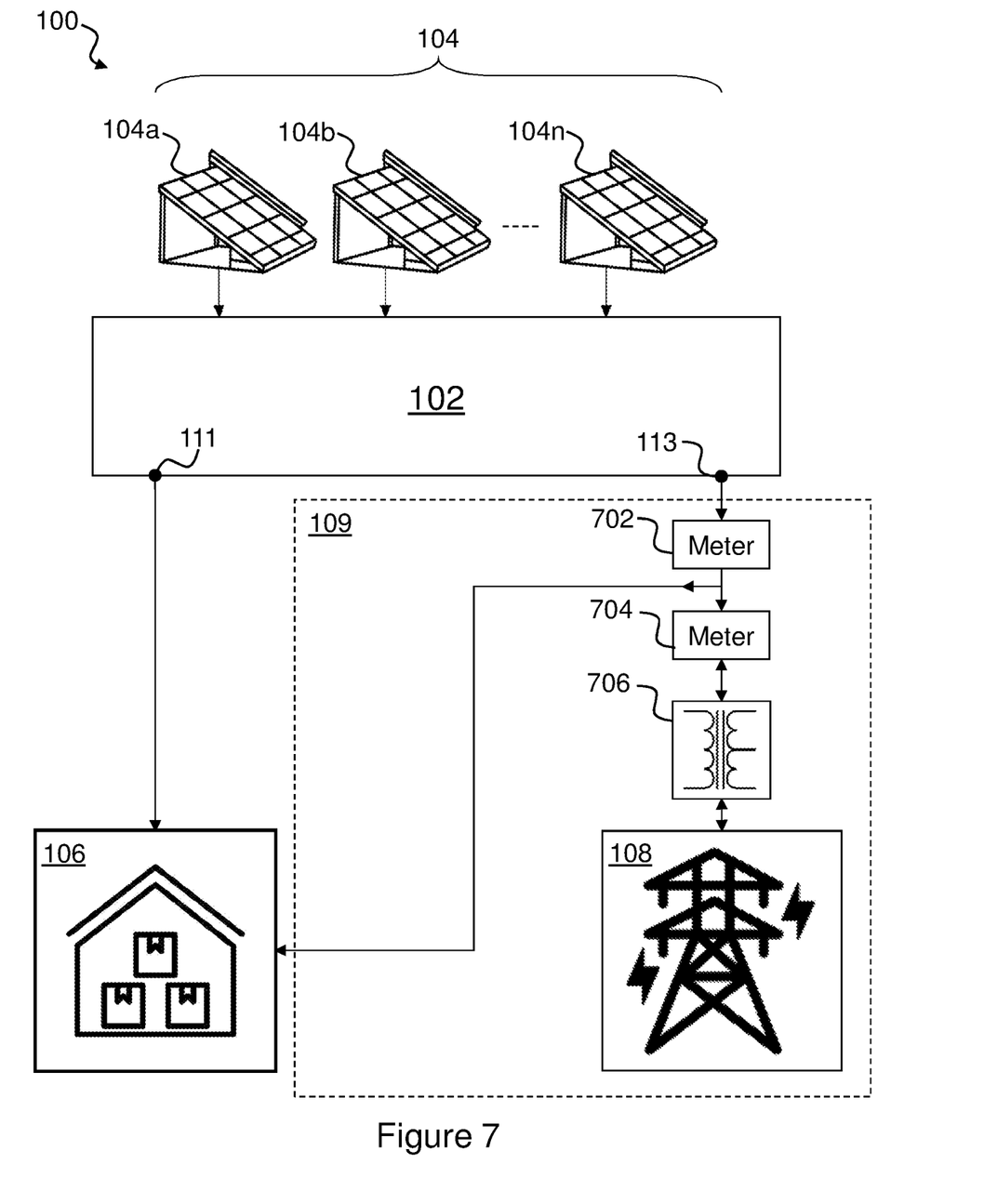
FIG. 7 is a schematic diagram showing in more detail another example of an electrical grid connection to the power distribution apparatus of FIG. 1 according to embodiments of the disclosure.

Referring again to FIG. 1, the power distribution apparatus 102 is shown distributing power via the second output node 113 to the second load 108, such as an electrical grid, via the grid connection 109. It will be appreciated that a country or region's electrical grid will typically have a set regulations governing connection to grid connection. These may include, for example, connection via a registered network meter operable to measure and/or regulate power going to and from the grid via the grid connection. It will also be appreciated that different electrical grids may have different governing regulations for such connections. Accordingly, the grid connection 109 may take various forms, depending on these regulations. FIGS. 5 to 7 provide some example configurations of the grid connection 109 accordingly to embodiments of the present disclosure. For clarity, connections from the power meters 114, 116, 118, 120 of the power distribution apparatus 102 have been omitted from these Figures.

Referring to FIG. 5, in some embodiments, the grid connection 109 between the second load 108 and each of the first load 106 and the solar array 104 may comprise a first electricity meter 502, a second electricity meter 504, a first transformer 506 and a second transformer 508.

The second load 108 is coupled to the first load 106 via the first (step down) transformer 506 and the first electricity meter 502. The first electricity meter 502 may be a conventional retail electricity meter for metering energy provided from the second load 108 to the first load 106. In other words, the first electricity meter 502 may be a zero-export meter. Thus, the connection between the second load 108 and the first load 106 may be a conventional connection in which power is supplied (one-way) to the first load 106.

The solar array 104 may be connected to the second load 108 via the power distribution apparatus 102, the second electricity meter 504 and then the second (step up) transformer 508. The second electricity meter 504 is configured to meter the amount of electricity being provided to the second load 108 from the solar array 104.

Connection from the solar array 104 to the first load 106 is made "behind the meter". Where the owner of the solar array 104 and the persons responsible for the first load 106 are different, energy provided to the first load 106 from the solar array 104 may be sold to the persons responsible for the first load 106 via one or more power purchase agreements (PPAs).

FIG. 6 shows another implementation of the grid connection 109 between the second load 108 and each of the first load 106 and the solar array 104, comprising a first electricity meter 602, a second electricity meter 604, and a first transformer 606. Like the implementation shown in FIG. 5, the first load 106 is connected to the second load 108 via a first electricity meter 602 and the solar array 104 is connected to the second load 108 via the second electricity meter 604. However, in contrast to the implementation shown in FIG. 5, the first and second electricity meters 602, 604 feed into a common transformer, the first transformer 606, to connect to the second load 108. Where the first load 106 is a local load associated with a building or group of buildings, the transformer 606 may be the same transformer used to connect the building to the retail electrical network. As such, first and second electricity meters 602, 604 are provided which may each participate in the market whilst using the same transformer for power transmission.

FIG. 7 shows yet another implementation of the grid connection 109 between the second load 108 and each of the first load 106 and the solar array 104, comprising a first electricity meter 702, a second electricity meter 704, and a transformer 706. In this implementation, the first and second electricity meters 702, 704 are connected in series. The first load 106 is connected to the second load 108 via the second electricity meter 704 and the transformer 706. The solar array 104 is connected to the second load 108 via the first electricity meter 602, the second electricity meter 704 and the same transformer 706. As such, the system 100 may be viewed from the perspective of the second load 108 as a single participant, the second electricity meter 704 monitoring the net consumption or output of electricity from/to the second load 108. The first electricity meter 702 may then be provided to measure the electricity provided to the second load 108 from the solar array 104 as a market participant (e.g. where the second load 108 is an electrical grid).

Figure 8:
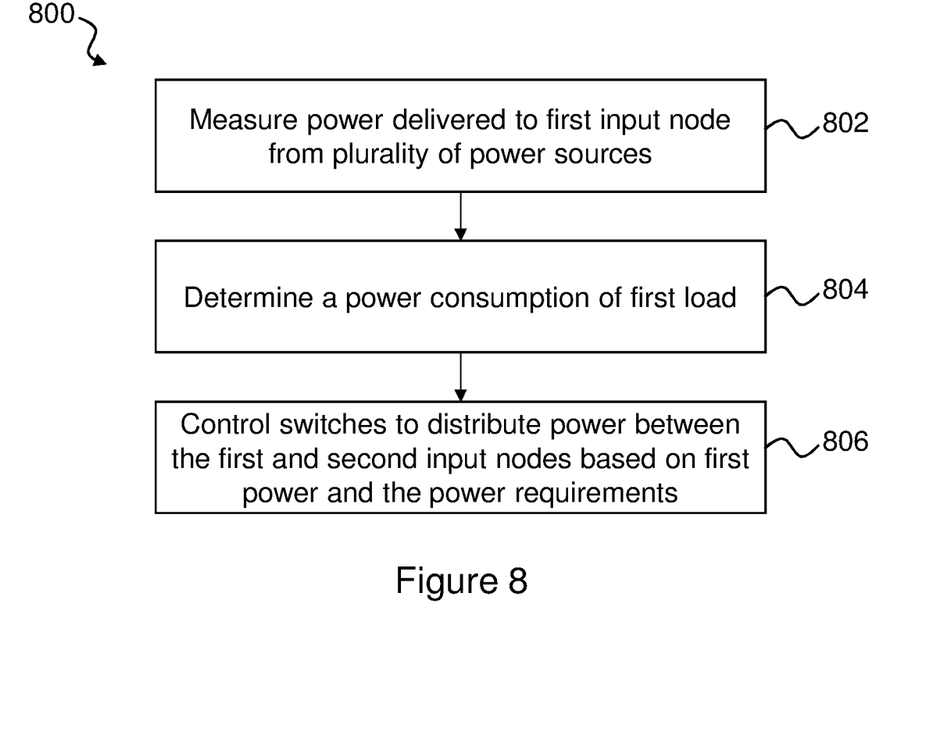
FIG. 8 is a flow diagram of a process performed by the power distribution apparatus of FIG. 1.

An example process 800 implemented by the voltage distribution apparatus 102 for control voltage distribution between the first and second loads 106 will now be described with reference to FIG. 8. In this process 800, the control module 112 may be operating with the aim of providing as much energy as is required by the first load 106 as can be provided by the solar array 104 at any one time. At step 802, power at the first input node is measured using the first power meter 114. The first power meter 114 may measure a voltage and/or a current at the first input node 111. The measured power (voltage and/or current) at the first input node 111 may be provided to the control module 112 in any suitable manner. Substantially simultaneously, the power requirements or consumption of the first load 106 may be determined at step 804. For example the second power meter 116 may measure the total power consumption of the first load 106. Where the first load 106 is also coupled to the second load 108, the total power consumption may be the aggregate of the power being provided to the first input node 111 and the power being provided to/from the third node 115. Additionally or alternatively, the fourth power meter 120 may measure the power being provided to the third node 115 to determine a power consumption of the first load 106. The second power meter 116 and/or the fourth power meter 120 may measure voltage and/or current requirements of the load first 106, such information being provided to the control module 112 in any suitable manner. At step 806, the control module 112 may then use power data received from the first power meter 114 and one or more of the second and fourth power meters 116, 120 to control the switch bank 110 to distribute power between the first and second loads 106, 108.

Figure 9:
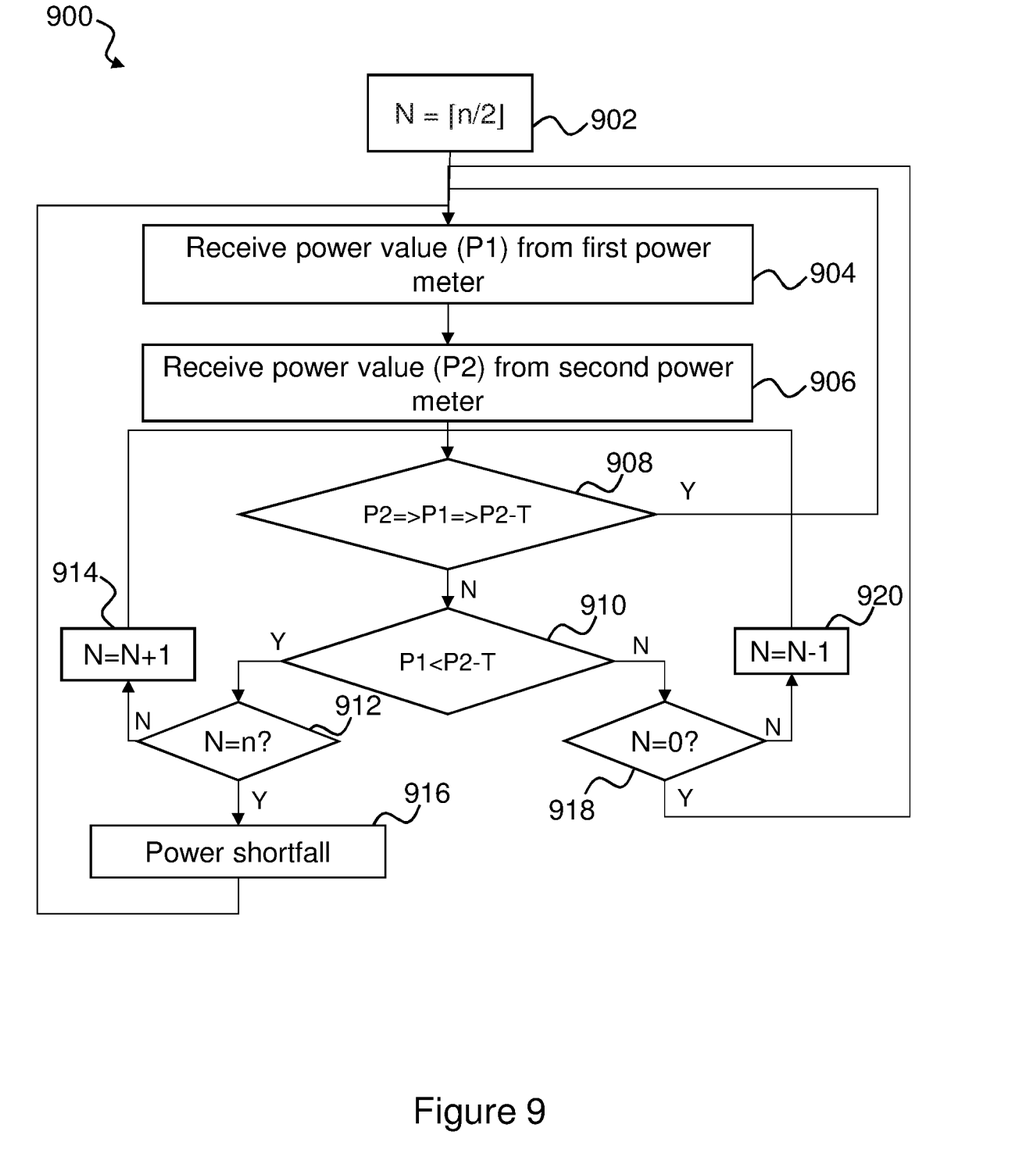
FIG. 9 is a flow diagram of a process performed by the power distribution apparatus of FIG. 1.

FIG. 9 shows an example process 900 for the controlling step 806 of process 800 according to embodiments of the disclosure. In an optional setup step, step 902, the switches 124 of the switch bank 110 may be switched by the control module 112 such that an initial number N of the solar panels 104a-104n of the solar array are switches to the first input node 111. For example, where the solar array comprises an equal number of n solar panels 104a-104n, an equal number of the switches 124 may be switched to the first input node 111 as to the second input node 113. Where the number n of solar panels 104a-104n is an odd number, the number N of switches 124 switched to the first input node 111 may be equal to the number of switches n divided by 2 rounded to the nearest integer, i.e. $N=\lceil n/2 \rceil$. This step 902 may of course be omitted.

At step 904, the control module 112 may receive a power value P1 measured by the first power meter 114 at the first input node 111. At step 906, the control module 112 may receive a power value P2 measured by the second power meter 116 representing the total power requirement or consumption of the first load 106.

At step 908, the control module 112 may determine whether the power P1 delivered to the first load 106 is within a threshold T of the power consumption P2 of the first load 106 such that the power being provided to the first input node 111 is substantially sufficient to service the first load 106. In some embodiments, the threshold T may be zero. In other embodiments, where power cannot be fed to the second load 108 via the third node 115, the threshold T may be a positive value, providing a buffer to prevent more energy than required by the first load 106 being provided through the first input node 111. This buffer may be required where energy transmission from the first load to the second load 108 is forbidden by energy regulators. The threshold T may equally be provided to provide a buffer to reduce switching frequency and therefore wear on switch gear.

If the condition at step 908 is met, process 900 returns to step 904.

If such a condition is not met, the process 900 continues to step 910 where the control module 112 determines whether power P1 being provided to the first input node 111 is more than the threshold T less than the power consumption P2 of the first load 106. If this condition is met, then at step 912 the control module 112 determines whether all of the solar panels 104a-104n are switched to the first load 106. If this is not the case, then at step 914 the control module 112 may switch one of the switches 124 of the switch bank 110 to increase the number of solar panels 104a-104n that are switched to the first input node 111. This process then returns to step 908.

If it is determined at step 912 that all of the switches 124 are switched to the first input node 111, then the control module 112 at step 916 may provide an output indicating that a power shortfall exists between the power being provided by the solar array 104 and the power consumption P2 of the first load 106. Where the first load 106 is also coupled to the second load 108 via the third node 115, the control module 112 may also indicate that the shortfall is being made up by power supplied from the second load 108 to the first load 106 via the third node 115. The process 900 may then return to step 904.

Returning to step 910, if it is determined that the power at the first input node 111 is not more than the threshold T less than the power consumption of the first load 106, then it follows that the power P1 provided to the first input node 111 is greater than the power consumption of the first load 106, meaning that the power being provided to the first load 106 by the solar array 104 is more than is required by the first load 106. The control module 112 then first checks at step 918 whether all of the switches 124 are switched to the second input node 113 (i.e. N=0) and then at step 920 reduces the number of switches 124 switched to the first input node 111 to reduce the power provided to the first load 106 by the solar array 104.

In embodiments of the present disclosure, the voltage distribution apparatus 102 are shown switching solar panels (or cells) or solar arrays. It will be appreciated, however, that voltage distribution apparatus described herein are not limited to the switching of solar generators and may be used to switch other power sources, such as power storage devices (e.g. batteries, capacitors etc.), wind generators, or the like.

It should be understood—especially by those having ordinary skill in the art with the benefit of this disclosure—that that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments and implementations likewise, with the benefit of this disclosure, will be apparent to those having ordinary skill in the art, and such embodiments should be deemed as being encompassed herein. Further, those having ordinary skill in the art will recognize that various equivalent techniques may be applied in lieu of, or in conjunction with, the discussed embodiments, and all such equivalents should be deemed as being encompassed by the present disclosure.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

It should be noted that the above-mentioned embodiments illustrate rather than limit the invention, and that those skilled in the art will be able to design many alternative embodiments without departing from the scope of the appended claims or embodiments. The word "comprising" does not exclude the presence of elements or steps other than those listed in a claim or embodiment, "a" or "an" does not exclude a plurality, and a single feature or other unit may fulfil the functions of several units recited in the claims or embodiments. Any reference numerals or labels in the claims or embodiments shall not be construed so as to limit their scope.

The invention claimed is:

1. A power distribution apparatus, comprising:
   a plurality of switches each operable to switch a respective power source of a plurality of power sources between a first input node of a first load and a second input node of a second load;
   a first power meter configured to determine a first power being delivered to the first input node from the plurality of power sources via the plurality of switches and generate a first power meter signal representing the determined first power;
   a second power meter configured to determine a power consumption of the first load and generate a second power meter signal representing the determined power consumption; and
   a control module configured to receive the first and second power meter signals and generate a switching signal based on the received first and second power meter signals to control each switch of the plurality of switches to distribute power between the first and second loads in dependence on the determined first power and the determined power consumption of the first load.

2. The power distribution apparatus of claim 1, wherein:
   each of the plurality of switches is configured to mechanically segregate a respective power source from one of the first load and the second load; and/or
   each respective power source comprises one or more solar cells and/or one or more power storage devices.

3. The power distribution apparatus of claim 1, wherein the first load is a local load and wherein the second load is an electrical grid.

4. The power distribution apparatus of claim 3, wherein the first load is coupled to the electrical grid via a third node.

5. The power distribution apparatus of claim 4, further comprising a first electricity meter coupled between the third node and the electrical grid and a second electricity meter coupled between the second input node and the electrical grid.

6. The power distribution apparatus of claim 4, wherein:
   the first and second electricity meters are coupled to the electrical grid via a common transformer; or
   the first and second electricity meters are coupled to the electrical grid via separate transformers.

7. The power distribution apparatus of claim 4, further comprising a first electrical meter coupled between the second input node and the third node, and a second electrical meter coupled between the third node and the electrical grid.

8. The power distribution apparatus of claim 3, wherein the power consumption determined by the second power meter is the power consumption of the first load from the electrical grid measured at the third node.

9. The power distribution apparatus of claim 1, wherein the power consumption determined by the second power meter is the total power consumption of the first load.

10. The power distribution apparatus of claim 1,
    wherein the control module is configured to control the plurality of switches such that the measured first power provided to the first input node is greater than or equal to the measured power consumption of the first load; and/or
    wherein the control module is configured to control the plurality of switches such that the measured first power provided to the first input node substantially matches the measured power consumption of the first load; and/or
    further comprising a third power meter configured to measure power being delivered to the second input node by the plurality of power sources via the plurality of switches, and wherein the control module is configured to control the switches to distribute power between the first and second loads in dependence on the measured power being delivered to the second input node; and/or
    wherein the plurality of power sources are direct current (DC) power sources, and wherein the apparatus further comprises an inverter coupled between each of the respective power sources and the plurality of switches to convert DC to alternating current (AC).

11. A system, comprising:
    the power distribution apparatus of claim 1; and
    the plurality of power sources.

12. A method of distributing power from a plurality of power sources between a first load and a second load, each of the plurality of power sources switchable between the first load and the second load by a respective switch of a plurality of switches, the method comprising:

determining a first power being delivered to a first input node from the plurality of power sources and generating a first power meter signal representing the determined first power;

determining a power consumption of the first load and generating a second power meter signal representing the determined power consumption;

generating a switching signal based on the received first and second power meter signals; and controlling each switch of the plurality of switches to distribute power between the first and second loads in dependence on the determined first power and the determined power consumption of the first load.

13. The method of claim 12, wherein:

each of the plurality of switches is configured to mechanically segregate a respective power source from one of the first load and the second load; and/or each respective power source comprises one or more solar cells and/or one or more batteries; and/or the first load is a local load and wherein the second load is an electrical grid.

14. The method of claim 13, wherein the first load is coupled to the electrical grid via a third node.

15. The method of claim 13, wherein determining the power consumption of the first load comprises measuring a power being delivered to the first load via the third node.

16. The method of claim 12, wherein the determined power consumption of the first load comprises the total power consumption of the first load.

17. The method of claim 12, further comprising measuring a second power being delivered to a second input node by the plurality of power sources via the plurality of switches, and wherein the switches are controlled in dependence on the measured second power being delivered to the second input node; and/or wherein the plurality of switches are controlled such that the determined first power provided to the first input node is greater than or equal to the determined power consumption of the first load; and/or wherein the plurality of switches are controlled such that the determined first power provided to the first input node substantially matches the determined power consumption of the first load.

* * * * *